Sept. 7, 1965

R. A. HYMAN ETAL 3,205,373

DIRECT COUPLED SEMICONDUCTOR SOLID STATE
CIRCUIT HAVING COMPLEMENTARY SYMMETRY

Filed Sept. 26, 1962

Inventors
ROBERT A. HYMAN
ARTHUR D. THOMAS
By Percy P. Lantzy
Attorney 3,205,373

DIRECT COUPLED SEMICONDUCTOR SOLID STATE CIRCUIT HAVING COMPLEMENTARY SYMMETRY

Robert Anthony Hyman and Arthur Derrick Thomas, London, England, assignors to International Standard Electric Corporation, New York, N.Y., a corporation of Delaware Filed Sept. 26, 1962, Ser. No. 226,343
6 Claims. (Cl. 307—88.5)

This invention relates to solid-state circuits, such as circuits incorporating direct coupling of components with complementary symmetry, for example, transistors.

According to the invention a solid-state circuit, incorporating direct coupling of components with complementary symmetry, comprises a single piece of semiconductor material having layers of alternate conductivity types in which are formed all the components having complementary symmetry, regions of the same conductivity type in the individual devices which are directly coupled to one another being formed in adjacent portions of the same layer of semiconductor material, regions of the same conductivity type in the individual devices which are indirectly coupled to one another being formed in portions of the same layer of semiconductor material separated by intermediate portions of the same layer, said intermediate portions having different conductivity characteristics.

According to one aspect of the invention certain portions of the layers of semiconductor material which form one or more regions of the semiconductor devices may be extended to provide additional circuit components such as, for example, a solar cell whereby the complete solid-state circuit may be self-powered.

In a solid-state circuit as described the said intermediate portions used to separate said similar regions of the individual devices in a common layer of semiconductor material may be of intrinsic semiconductor material, which is predominantly insulation. Where the circuit components are grouped around such an insulating portion of semiconductor material an inductive coupling loop may be formed enabling the complete circuit to be coupled to other circuits without the use of ohmic contacts.

Figure 1:
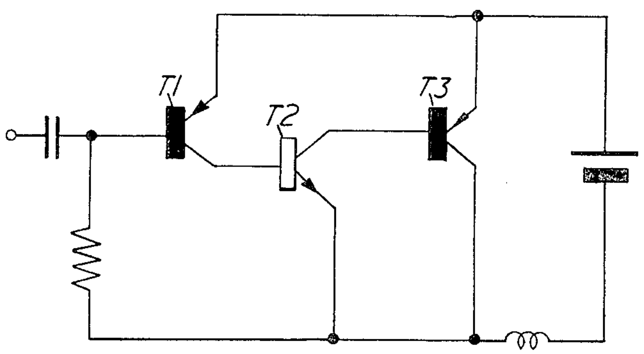
Figure 2:
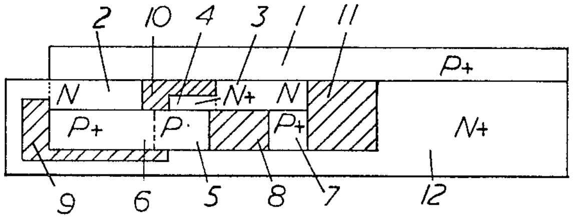

In order that the invention may be more clearly understood, one example thereof is now described with reference to the accompanying drawings in which:

FIG. 1 is a schematic circuit diagram of a circuit according to the invention, and FIG. 2 is a diagrammatic section through a slice of semiconductor material showing the arrangement of the various layers which make up a solid-state circuit equivalent to FIG. 1.

A well-known method of direct coupling complementary transistors is shown in the circuit depicted in FIG. 1. This circuit shows three transistors T1, T2 and T3 which are respectively PNP, NPN and PNP, coupled together with suitable biasing and power supplies.

In the arrangement shown in FIG. 2 the circuit of FIG. 1 is incorporated into a single piece of semiconductor material. The various components are formed by carefully diffusing into different portions of the piece of semiconductor material impurities to create regions having the required characteristics.

The example shown in FIG. 2 will be described as being made of silicon, although the invention is not limited to the use of this particular semiconductor material.

In the arrangement shown in FIG. 2, the layer 1 forms the emitters of the two PNP transistors and the positive terminal of a solar cell power supply. This layer could have an impurity concentration of $10^{21}$ atoms per cm.$^3$, making it a P+ layer of silicon. The layer 2 is of N type material and forms the base of transistor T1. The N layer 3 forms in a similar manner the base of transistor T3. The N layer 3 has an extended portion 4 of N+ material which forms the collector of the NPN transistor T2. The N type material in layers 2 and 3 may have an impurity concentration of about $10^{16}$ atoms per cm.$^3$, whereas the N+ layer 4 might have an impurity concentration in excess of $10^{19}$ atoms per cm.$^3$. The layers 6 and 7 of P+ material form the collectors of the PNP transistors T1 and T3. The layer 5 of P type material forms the base of the NPN transistor T2.

In effect, therefore, the PNP transistor T1 is formed of the layers 1, 2 and 6, the NPN transistor T2 is formed by the layers 4, 5 and 12 and the PNP transistor T3 is formed by the layers 1, 3 and 7.

The layers 8, 9, 10 and 11 are of intrinsic material and provide D.C. blocking sections between the components. The circuit is powered by a solar cell formed by the junction of the layer 1 and the layer 12. The layer 12 of N+ type material may have an impurity concentration of about $10^{18}$ atoms per cm.$^3$. The layer 12 besides being the negative terminal of the solar cell and the emitter of the NPN transistor T2 is extended around the intrinsic portion 9 and provides a path to the layer 2 for the D.C. biasing of the base of the PNP transistor T1.

The input signal to the circuit can be capacitatively coupled into the base of the PNP transistor T1 thus eliminating the necessity for ohmic contacts. For the same reason the output of the circuit can be derived inductively. In our co-pending patent application Serial No. 144,649, filed October 12, 1961, and assigned to the same assignee as the instant application, there is shown a method of providing a self-powered solid-state circuit formed around a hole in a piece of semiconductor material enabling the circuit to be inductively coupled to external circuitry. In the present invention this may be achieved by inductive coupling to the arrangement shown in FIG. 2 by means of the loop around region 11 provided by layers 12 and 7 and completed through layers 1 and 3. The self inductance inherent in these layers is similar to that described in the above mentioned copending application showing such layers surrounding a hole in place of the intrinsic material layer 11. Output coupling may be provided by another juxtaposed loop or a printed inductor for example.

The invention may be achieved by the use of any normal fabrication techniques. For example, the layers containing the different impurity concentrations may be formed by careful shaping and diffusion of the impurities into the basic piece of semiconductor material, or they may be formed by the addition of impurities during the manufacture of the basic material by epitaxial growth techniques, or by any suitable method for the manufacture and treatment of semiconductor materials.

The invention is equally applicable to an arrangement having two NPN transistors and one PNP transistor, and is not necessarily restricted to a circuit having only three transistors. Any number of transistors, alternately NPN and PNP may be directly coupled in a single piece of semiconductor material in the manner described.

It is to be understood that the foregoing description of specific examples of this invention is not to be considered as a limitation on its scope.

What we claim is:

1. A semiconductor circuit formed in a common piece of material comprising a plurality of direct coupled transistors having complementary symmetry and each including input, output and common electrodes, a first layer of one conductivity type including a portion forming the output electrode of one transistor and a second portion forming the input electrode of another transistor, a second layer of a second conductivity type adjacent said first layer forming the input electrode of said one transistor and the output electrode of said other transistor, a region of intrinsic material in said second layer separating the two electrodes therein, and further layers of each conductivity type forming the common electrodes of said transistors adjacent respective said first and second layers of different conductivity type.

2. The semiconductor circuit of claim 1 wherein said further layers include a third layer of said one conductivity type adjacent said second layer on the side opposite said first layer, said third layer forming the common electrode of said one transistor, and a fourth layer of said second conductivity type adjacent said first layer on the side opposite said second layer forming the common electrode of said other transistor.

3. The semiconductor circuit of claim 2 including a third direct coupled transistor having input, output and common electrodes wherein said first layer includes one of the input and output electrodes of said third transistor and a region of intrinsic material separating said one electrode from said electrodes of said first and second transistors therein, and said second layer includes the other of said input and output electrodes of said third transistor formed together with and connected as a different electrode from one of said two separated electrodes therein, the third common electrode being formed of one of the layers forming the other common electrodes.

4. The semiconductor circuit of claim 3 wherein said two conductivity type layers forming said common electrodes of said transistors form a junction providing a source of voltage.

5. The semiconductor circuit of claim 4 including a further region of intrinsic material between said junction and said first and second layers, wherein one of said layers of one conductivity type forming said junction is connected to an output electrode of the other conductivity type in one of said first and second layers and forms a coupling loop thereto.

6. The semiconductor circuit of claim 5 wherein said one layer forming said junction voltage source is connected directly to the same conductivity type input electrode of said third transistor and including another region of intrinsic material between said one junction layer and the output electrode of said third transistor.

References Cited by the Examiner

UNITED STATES PATENTS

| | | | |
|---|---|---|---|
| 2,944,165 | 7/60 | Stuetzer | 307—88.5 X |
| 2,976,426 | 3/61 | Rappaport | 307—88.5 |
| 2,985,804 | 5/61 | Buie | 317—235 |
| 3,029,366 | 4/62 | Lehovec | 307—88.5 |
| 3,103,599 | 9/63 | Henkels | 307—88.5 |

ARTHUR GAUSS, *Primary Examiner.*